United States Patent [19]
Kay

[11] Patent Number: 5,389,833
[45] Date of Patent: Feb. 14, 1995

[54] ANALOG MULTIPLEXER

[75] Inventor: Michael R. Kay, Dallas, Tex.

[73] Assignee: Texas Instruments Incorporated, Dallas, Tex.

[21] Appl. No.: 936,169

[22] Filed: Aug. 27, 1992

[51] Int. Cl.⁶ .................. H03K 17/16; G11C 27/02
[52] U.S. Cl. ......................... 327/96; 330/261; 327/408
[58] Field of Search .......... 307/243, 353, 359; 330/261

[56]   References Cited
U.S. PATENT DOCUMENTS

| 4,716,381 | 12/1987 | Campell ............... 330/261 X |
| 4,881,044 | 11/1989 | Kinoshita et al. ....... 330/261 X |
| 5,180,932 | 1/1993 | Bengel ................. 307/353 |
| 5,185,582 | 2/1931 | Barbu .................. 330/261 |

Primary Examiner—Willis R. Wolfe
Attorney, Agent, or Firm—René Grossman; Richard L. Donaldson

[57]   ABSTRACT

A multiplex system wherein each of the multiplex circuits includes a hold switch and hold capacitor, a standard class A differential amplifier with constant feeding current source, a multiplex switch to selectively isolate each multiplex circuit from the common multiplex line and a second current source supplying much larger current than the constant feeding current source selectively couplable in parallel with the constant feeding current source to the differential amplifier during periods when the differential amplifier is coupled to the common multiplex line.

22 Claims, 2 Drawing Sheets

ANALOG MULTIPLEXER

BACKGROUND OF THE INVENTION

1. Field of the Invention

This invention relates to high performance analog multiplexers. 2. Brief Description of the Prior Art When large quantities of analog data are generated on chip, such as in the case of a focal plane array (FPA), it is necessary to time-domain multiplex (MUX) the signals so that the data can be read serially off chip. With the recent and continuing improvements in detector performance (use of photodiodes such as vertically integrated photodiodes (VIP) instead of photocapacitors, such as vertically integrated metal insulator semiconductors (VIMIS)), the performance of the CMOS circuits that process the detector output also require considerable improvement in order to make full use of the improved detectors.

One standard analog multiplex solution has been the use of a common load source follower multiplexer. A two transistor source follower amplifier is used with a multiplexing switch in each branch of the circuit. The current source transistor of the amplifier is common to all of the input transistors in each of the branches and therefore constantly supplies power to only the branch in use, which minimizes the power consumption. This configuration has two serious second order problems and at least a half dozen performance deficiencies, among these being scan direction crosstalk and positive feedback which causes the amplifier to run significantly slower than predicted.

Another solution is to use one operational amplifier per branch (5 transistor differential amplifier in unity gain mode, for example). This delivers the performance necessary but uses excessive power since each multiplex stage is using full power at all times. Minimizing power consumption is always desirable, but when working at cryogenic temperature, it is absolutely necessary.

It is therefore apparent that an improved analog multiplexer which eliminates one or more of the deficiencies of the prior art analog multiplexer is highly desirable.

SUMMARY OF THE INVENTION

In accordance with the present invention, there is provided a high performance multiplexer circuit on a single chip which holds the large quantities of data generated by the infrared (IR) detectors and samples each detector serially, feeding the information into a post amplifier to be read off chip for further signal processing. The circuit provides low fixed pattern noise, low power requirement, high linearity, high speed, requires minimum chip area, has no second order effects, has no DC level shift, is stable and easy to implement.

Briefly, the multiplexer circuit comprises a post amplifier to which is coupled a separate circuit for each detector. Each of the separate circuits comprises a hold switch between the associated detector and a hold capacitor to store the charge received from the associated detector. The hold capacitor is coupled to a standard five transistor class A differential amplifier configured in unity gain mode and having a separate switchable high power current source selectively coupled thereto and a multiplex switch for selectively coupling the separate circuit to the post amplifier. A typical focal plane array (FPA) may have, for example, 240 detector elements with a separate circuit associated with each detector element, each of the separate circuits being multiplexed serially in some predetermined order to provide serial signals to the postamplifier.

In operation, the hold switch is closed and opened periodically to store the charge received from the associated detector on the hold capacitor. Then the multiplex switch and the associated switch to the high current source in each separate circuit are simultaneously closed, this closing action taking place serially from separate circuit to separate circuit to provide the serial multiplexed output to the postamplifier.

A significant feature of the invention is the addition to the standard differential amplifier circuit of the selectively switchable high power current source (or turbo current source) in parallel with the standard current source which forms a part of the standard differential amplifier circuit. The turbo current source significantly reduces the power requirement of the differential amplifier but also maintains the high speed thereof. The differential amplifier only requires the high power when driving the multiplex line (high parasitic capacitance). Therefore, switching on and off of the high current permits the fast operation from a very low power circuit. The standard current source of the differential amplifier sinks just enough current to keep the amplifier from floating to unknown states when the multiplex switch and turbo switch are off or in the open condition.

DESCRIPTION OF THE PREFERRED EMBODIMENT

Figure 1:
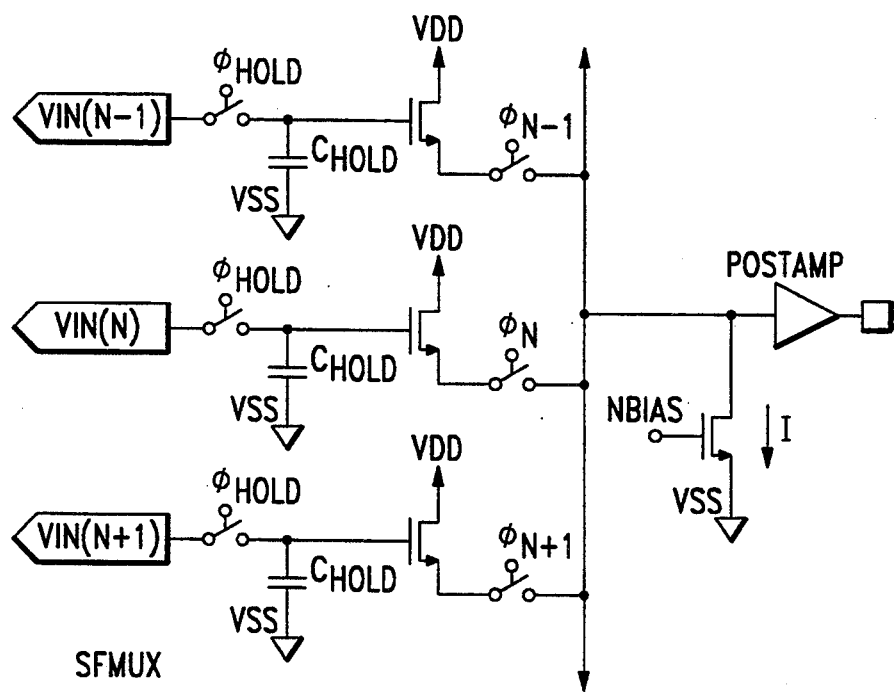
FIG. 1 is a circuit diagram of a typical prior art multiplex circuit from three of plural detectors.

Referring first to FIG. 1, there is shown a circuit diagram of a portion of a multiplex circuit in accordance with the prior art as discussed hereinabove. Charge from a detector is stored on the hold capacitor $C_{HOLD}$ while the hold switch $\phi_{HOLD}$ is closed with a readout being provided to the multiplex output upon opening of switch $\phi_{HOLD}$ followed by closing of multiplex switch $\phi_{MUX}$. This circuit presents many problems, one of which is the fact that there is a stray capacitance between gate and source, $C_{gs}$, and between base and source, $C_{bs}$. Capacitance $C_{bs}$ stores the signal value on the intermediate multiplex node at the drain of the transistor so that, when the next signal value arrives, a portion of the signal is fed through capacitance $C_{gs}$ and onto the hold node at the gate of the transistor. This will appear to be a scan direction crosstalk. A second problem occurs when switch $\phi_{MUX}$ is closed wherein capacitance $C_{gs}$ creates a positive feedback loop which causes the circuit to operate much slower than predicted and changes the voltage held on capacitor $C_{HOLD}$.

Figure 2:
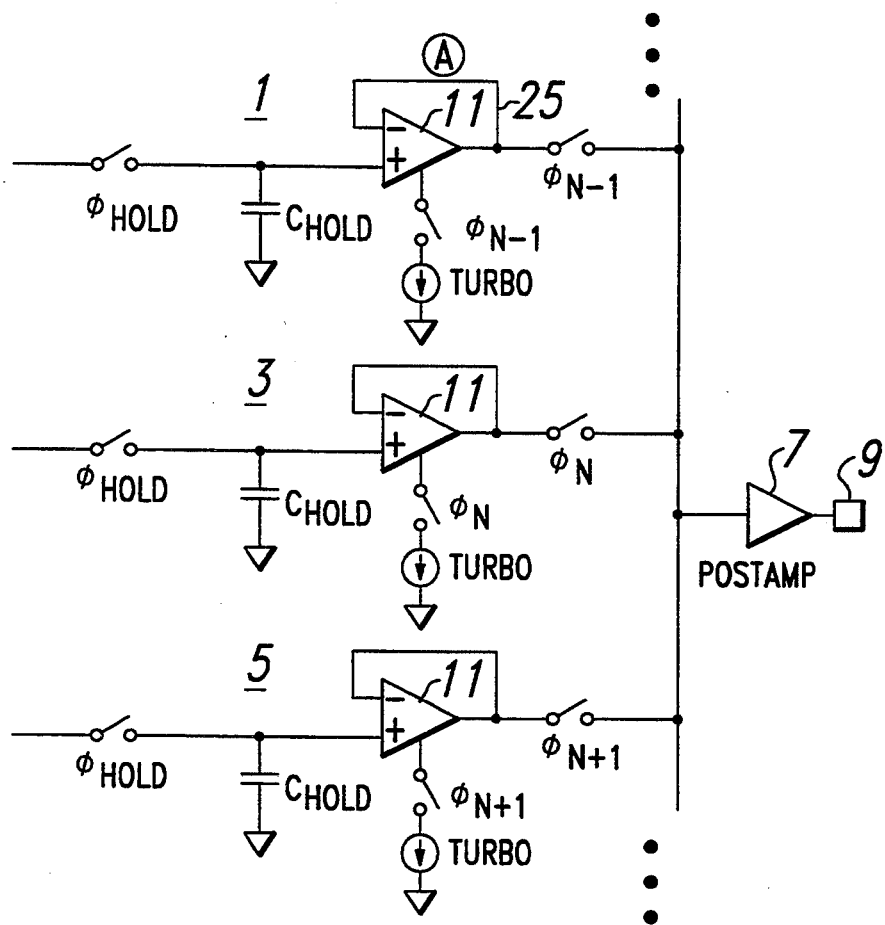
FIG. 2 is a block diagram of a multiplex circuit in accordance with the present invention.

Referring now to FIG. 2, there is shown a block diagram of a multiplexing circuit in accordance with the present invention. The multiplexing circuit includes a plurality of separate circuits 1, 3 and 5, each connected to a postamplifier 7, the output of which is coupled to a chip pad 9. Each of the circuits 1, 3 and 5 is coupled to an associated detector (not shown) and includes a hold switch $\phi_{HOLD}$ downstream from the associated detector and a hold capacitor $C_{HOLD}$ downstream from the hold switch and coupled to the positive input of a unity gain differential amplifier 11. Each differential amplifier 11 is selectively coupled to a high current source or turbo via a switch $\phi_{N-1}$ in circuit 1, switch $\phi_N$ in circuit 3, switch $\phi_{N+1}$ in circuit 5, etc. for the remaining separate circuits. A feedback loop is provided between the output of each differential amplifier 11 and the negative input thereof. The output of each differential amplifier 11 is coupled to the postamplifier 7 via a switch $\phi_{N-1}$ in circuit 1, switch $\phi_N$ in circuit 3, switch $\phi_{N+1}$ in circuit 5, etc. for the remaining separate circuits which is operated simultaneously with the switch with identical reference number coupled to the turbo.

Figure 3:
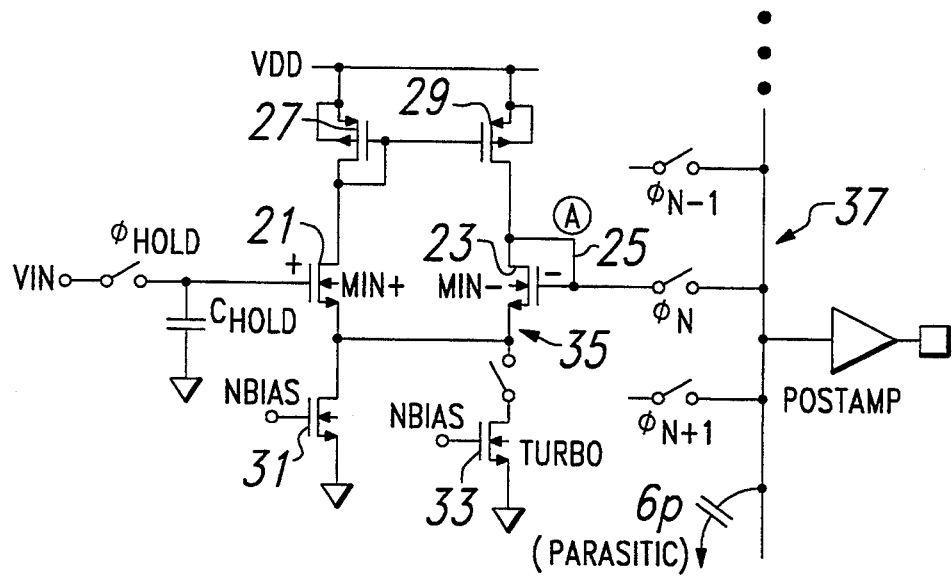
FIG. 3 is a circuit diagram of the circuit of FIG. 2.

Referring now to FIG. 3, there is shown the separate circuit 3 of FIG. 2 in greater detail wherein identical reference characters refer to identical circuit elements. As can be seen, the differential amplifier 11 of FIG. 2 includes the + and − inputs at the gates of transistors 21 and 23 respectively and includes transistors 21, 23, 27, 29 and 31 which form a standard textbook differential amplifier aside from the turbo transistor 33 which is explained hereinbelow. The feedback path 25 is shown between the drain and gate of transistor 23. Additional current mirror transistors 27 and 29 are coupled to a voltage source $V_{DD}$ in standard manner. Transistor 31 is the standard current source for the differential amplifier 11 and transistor 33 is the turbo or high current source and provides much greater current to the differential amplifier than does transistor 31 by a factor of about 100. The current in transistor 31 is set so that node 35 settles to its final value while the $\phi_{HOLD}$ switch is closed. This is generally several microamperes ($\mu A$). The current in transistor 33 is set so that the multiplex line 37 settles to its final value during $\phi_N$. As noted above, the current ratio between transistors 31 and 33 is generally about 100, however this ratio can be altered as required. This ratio is generally accomplished by making transistor 33 much larger than transistor 31 on the same chip. The transistors 31 and 33 are biased into the conducting state by the same bias input, however transistor 31 will immediately conduct when appropriately biased whereas transistor 33 will conduct only when appropriately biased and with switch $\phi_N$ closed. The amplifier 11 is unity gain so the output of thereof should track the condition of the hold capacitor $C_{HOLD}$.

Figure 4:
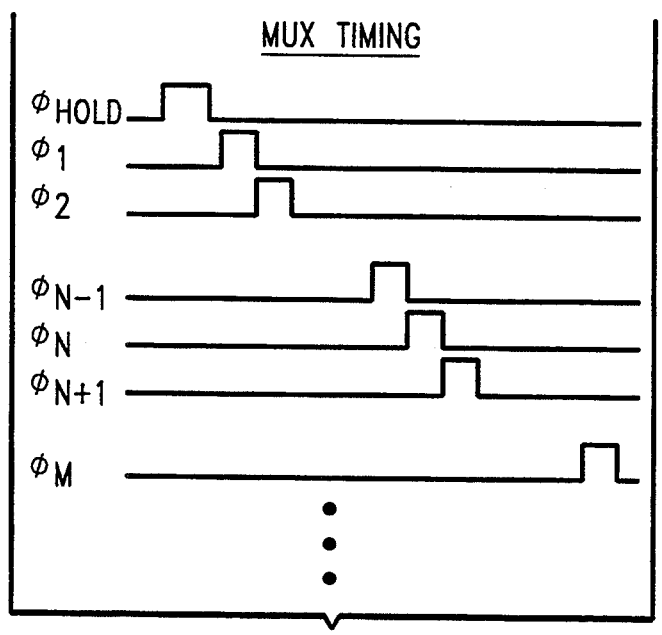
FIG. 4 is a timing diagram for use in conjunction with the circuit of FIGS. 1, 2 and 3.

In operation, and with reference to FIGS. 2, 3 and 4, current from the detectors (not shown) is constantly being applied to input $V_{IN}$. The switches $\phi_{HOLD}$ in each of the separate circuits are closed in a predetermined succession and then opened as shown in the timing diagram of FIG. 4 to charge the associated hold capacitor $C_{HOLD}$ and then isolate that capacitor from the associated detector. The charge on hold capacitor $C_{HOLD}$ is applied to the +input of the differential amplifier 11. Meanwhile, transistor 31 is conductive due to the bias on the gate thereof provided by an on-chip bias generator (not shown) and constantly applied to the gate. Transistor 33 is capable of conducting due to the bias thereon but for the fact that switch $\phi_N$ is open. Now, when switches $\phi_N$ are closed, the high current from the turbo 33 is applied to the amplifier 11 and the circuit 3 is coupled to the postamplifier 7 via now closed multiplex switch $\phi_N$. Switches $\phi_N$ then close and the cycle is repeated for the next separate circuit, etc. in standard manner.

It can also be seen that if the circuit is to settle, for example to 5 volts in 100 nanoseconds, and the stray capacitance in the circuit is, for example, 6 pf, then about 300 microamperes (I=C(dv/dt)) of current will be required in transistor 33. Assuming a 10 volt power supply and 240 detectors, the power requirement is quite large, about 720 milliwatts. Accordingly, the introduction of the large current supply from the turbo transistor 33 periodically rather than continually as described above provides a substantial power saving (about 10 milliwatts) and minimizes heat generation. Furthermore, without the turbo high current source 33 a great deal of power would have to be consumed (assuming 240 separate circuits were being used simultaneously at about a 4 MHz data rate and 6 pf capacitance on the multiplex line) in order to provide sufficiently high operating speeds (about 100 nanoseconds of settling). The high power is required only when the multiplex switch $\phi_N$, . . . is closed which, in the case of 240 separate circuits, is only 1/240th of time. This is especially important in the case of focal plane arrays wherein the array is maintained at cryogenic temperatures, generally about −196° C. (77° K.) and wherein the heat generated by the multiplexer will have a detrimental effect on the array performance.

The high current is applied to each of the differential amplifiers only for the short period when the switch coupling the turbo 33 to the associated differential is closed, thereby providing the power saving. It follows that the speed advantages of a high current amplifier are present without the high power disadvantages.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

It is claimed:
1. A multiplex circuit comprising:
   (a) an amplifier having a first current source continually coupled thereto;
   (b) a second current source providing substantially higher values of current to said amplifier than said first current source, said second current source selectively coupled to said amplifier; and
   (c) a postamplifier and a switch selectively coupling and uncoupling said amplifier and said postamplifier simultaneously with the coupling and uncoupling of said second current source and said amplifier.

2. The circuit of claim 1 wherein said amplifier is a differential amplifier and includes a first input terminal, a second input terminal, an output terminal and a feedback path between said output terminal and said second input terminal, further including a capacitor coupled to said first input terminal for storing charge applied to said first input terminal from a remote source.

3. The circuit of claim 1 wherein said second current source is coupled in parallel with said first current source.

4. The circuit of claim 2 wherein said second current source is coupled in parallel with said first current source.

5. A multiplex circuit comprising:
   (a) an amplifier having a first current source continually coupled thereto to provide a continual current thereto; and (b) a second current source providing substantially higher values of current to said amplifier than said first current source, said second current source selectively coupled to said amplifier.

6. The circuit of claim 5 wherein said second current source is coupled in parallel with said first current source.

7. The circuit of claim 5, wherein said amplifier is a differential amplifier and includes a first input terminal, a second input terminal, an output terminal and a feedback path between said output terminal and said second input terminal, further including a capacitor coupled to said first input terminal for storing charge applied to said first input terminal from a remote source.

8. The circuit of claim 7 wherein said second current source is coupled in parallel with said first current source.

9. The circuit of claim 5 wherein said first current source and said second current source are connected in parallel with each other.

10. A multiplex system comprising:
(a) a plurality of multiplex circuits, each said multiplex circuit comprising:
    (i) an amplifier having a first current source continually coupled thereto;
    (ii) a second current source providing substantially higher values of current to said differential amplifier than said first current source, said second current source selectively coupled to said amplifier, the second current source of each of said separate circuits being coupled to their associated amplifier at selectively spaced, non-overlapping time periods;
(b) further including a postamplifier and a switch selectively coupling and uncoupling each said amplifier and said postamplifier simultaneously with the coupling and uncoupling of the associated said second current source and said amplifier.

11. The circuit of claim 10 wherein said second current source is coupled in parallel with said first current source.

12. The circuit of claim 10 wherein said amplifier is a differential amplifier and includes a first input terminal, a second input terminal, an output terminal and a feedback path between said output terminal and said second input terminal, further including a capacitor coupled to said first input terminal for storing charge applied to said first input terminal from a remote source.

13. The system of claim 12 wherein each said capacitor is selectively coupled and uncoupled from said remote source.

14. The circuit of claim 10 wherein said second current source is coupled in parallel with said first current source.

15. The system of claim 14 wherein each said capacitor is selectively coupled and uncoupled from said remote source.

16. A multiplex system comprising:
(a) a plurality of multiplex circuits, each said multiplex circuit comprising:
    (i) an amplifier having a first current source continually coupled thereto; and
    (ii) a second current source providing substantially higher values of current to said differential amplifier than said first current source, said second current source selectively coupled to said amplifier, the second current source of each of said separate circuits being coupled to their associated amplifier at selectively spaced, non-overlapping time periods.

17. The system of claim 16 wherein each said second current source is coupled in parallel with its associated said first current source.

18. The circuit of claim 16 wherein said first current source and said second current source are connected in parallel with each other.

19. The system of claim 16, wherein said amplifier is a differential amplifier and includes a first input terminal, a second input terminal, an output terminal and a feedback path between said output terminal and said second input terminal, further including a capacitor coupled to said first input terminal for storing charge applied to said first input terminal from a remote source.

20. The system of claim 19 wherein each said capacitor is selectively coupled and uncoupled from said remote source.

21. The system of claim 19 wherein each said second current source is coupled in parallel with its associated said first current source.

22. The system of claim 21 wherein each said capacitor is selectively coupled and uncoupled from said remote source.

* * * * *